United States Patent
Ali et al.

(10) Patent No.: US 12,363,869 B2
(45) Date of Patent: Jul. 15, 2025

(54) HEAT DISSIPATION DEVICE

(71) Applicant: NIDEC CHAUN-CHOUNG TECHNOLOGY CORPORATION, New Taipei (TW)

(72) Inventors: Abbas Ali, New Taipei (TW); Bin-Wei Goh, New Taipei (TW); Shao-Chien Lu, New Taipei (TW)

(73) Assignee: NIDEC CHAUN-CHOUNGTECHNOLOGY CORPORATION, New Taipei (TW)

( * ) Notice: Subject to any disclaimer, the term of this patent is extended or adjusted under 35 U.S.C. 154(b) by 218 days.

(21) Appl. No.: 18/234,312

(22) Filed: Aug. 15, 2023

(65) Prior Publication Data

US 2025/0063695 A1    Feb. 20, 2025

(51) Int. Cl.
*H05K 7/20* (2006.01)

(52) U.S. Cl.
CPC ..... *H05K 7/20409* (2013.01); *H05K 7/20145* (2013.01)

(58) Field of Classification Search
CPC ............... H01L 23/467; H01L 23/3672; H01L 21/4882; H01L 23/36; H01L 23/3736; F28D 15/0233; F28F 3/02; F28F 13/06; F28F 1/14; F28F 3/12; H05K 7/20145; F24F 1/24
USPC .......... 361/704, 697, 709, 710, 679.48, 695, 361/703, 719; 65/80.3; 165/104.33; 257/E23.099, 722, 706, 713
See application file for complete search history.

(56) References Cited

U.S. PATENT DOCUMENTS

| | | | | |
|---|---|---|---|---|
| 6,598,667 | B1 * | 7/2003 | Kuo | H01L 23/467 257/E23.099 |
| 6,899,164 | B1 * | 5/2005 | Li | H01L 21/4878 257/722 |
| 7,637,311 | B2 * | 12/2009 | Zheng | F28D 15/0275 165/104.33 |
| 10,371,457 | B2 * | 8/2019 | Chen | F28D 15/0275 |
| 10,939,586 | B2 * | 3/2021 | Van Der Veer | F28F 3/025 |
| 11,043,442 | B2 * | 6/2021 | Xu | F28F 3/06 |
| 2004/0045701 | A1 * | 3/2004 | Chen | H01L 23/3672 174/16.3 |
| 2005/0082034 | A1 * | 4/2005 | Hwang | H01L 23/467 257/E23.099 |
| 2007/0139886 | A1 * | 6/2007 | Xia | H01L 23/467 257/E23.099 |

(Continued)

FOREIGN PATENT DOCUMENTS

CN        220041065 U  *  11/2023

*Primary Examiner* — Mandeep S Buttar
(74) *Attorney, Agent, or Firm* — Chun-Ming Shih; hdls ipr services

(57) ABSTRACT

A heat dissipation device with a heat-insulating channel includes a thermal conductive substrate, multiple heat dissipation fins stacked with spacing from one another on the thermal conductive substrate, and at least one insulation guiding component. The heat dissipation fins have at least one configuration space for the insulation guiding component to be installed, a bottom portion, two sides upwardly extended from the bottom portion, and a channel enclosed by the bottom portion and two sides. A width of the channel is at least greater than the spacing between any two adjacent heat dissipation fins.

12 Claims, 5 Drawing Sheets

(56) References Cited

U.S. PATENT DOCUMENTS

| | | | |
|---|---|---|---|
| 2008/0068805 A1* | 3/2008 | Xu | H05K 7/20509 |
| | | | 361/710 |
| 2009/0310306 A1* | 12/2009 | Yu | H01L 23/467 |
| | | | 165/185 |
| 2017/0303430 A1* | 10/2017 | Enami | B61C 3/00 |

* cited by examiner

HEAT DISSIPATION DEVICE

BACKGROUND OF THE DISCLOSURE

Technical Field

The technical field relates to a heat sink, and more particularly relates to a heat dissipation device with a heat-insulating channel.

Description of Related Art

Related-art fin heat sinks or heat dissipation devices are generally equipped with a plurality of heat dissipation fins on the bottom of that receives heat, and an increase in the number of heat dissipation fins can help increase the amount of heat that can be absorbed by the fins, which in turn improves the efficiency of heat conduction. Therefore, the related-art fin heat dissipation devices are constantly increasing the number of fins on the limited bottom, especially by reducing the spacing between the fins to make more space in order to install more fins.

However, with the above design concept, the spacing of the fins is continuously reduced to increase the heat and flow resistance between the fins, making it difficult for external air to pass through the spacing between the fins to carry away the heat. Therefore, even though the heat dissipation efficiency can be improved by having more fins, the heat dissipation efficiency of the external air on the convection is greatly reduced due to the increase in heat resistance and flow resistance.

In view of the aforementioned drawbacks, the discloser of this disclosure conducted extensive research in conjunction with application of theories, and finally came up a reasonable and feasible design to improve and overcome the drawbacks of the prior art.

SUMMARY OF THE DISCLOSURE

Therefore, it is a primary objective of this disclosure to provide a heat dissipation device with a heat-insulating channel, which uses a hollow insulation guiding component to maintain a lower temperature status of external airflow and guide the external airflow to a corresponding heat source inside the heat sink or the heat dissipation device to reduce the heat resistance and flow resistance and increase the heat dissipation efficiency of the external airflow on the convection, and further achieve the effect of reducing materials.

To achieve the aforementioned and other objectives, this disclosure provides a heat dissipation device with a heat-insulating channel, which includes a thermal conductive substrate, a plurality of heat dissipation fins stacked on the thermal conductive substrate with a spacing from one another, and at least one insulation guiding component, and the heat dissipation fin having at least a configuration space, and the insulation guiding component being installed in the configuration space, and the insulation guiding component having a bottom portion, two sides upwardly extended from the bottom portion, and a channel enclosed by the bottom portion and the two sides. A width of the channel is at least greater than the spacing between any two adjacent heat dissipation fins.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
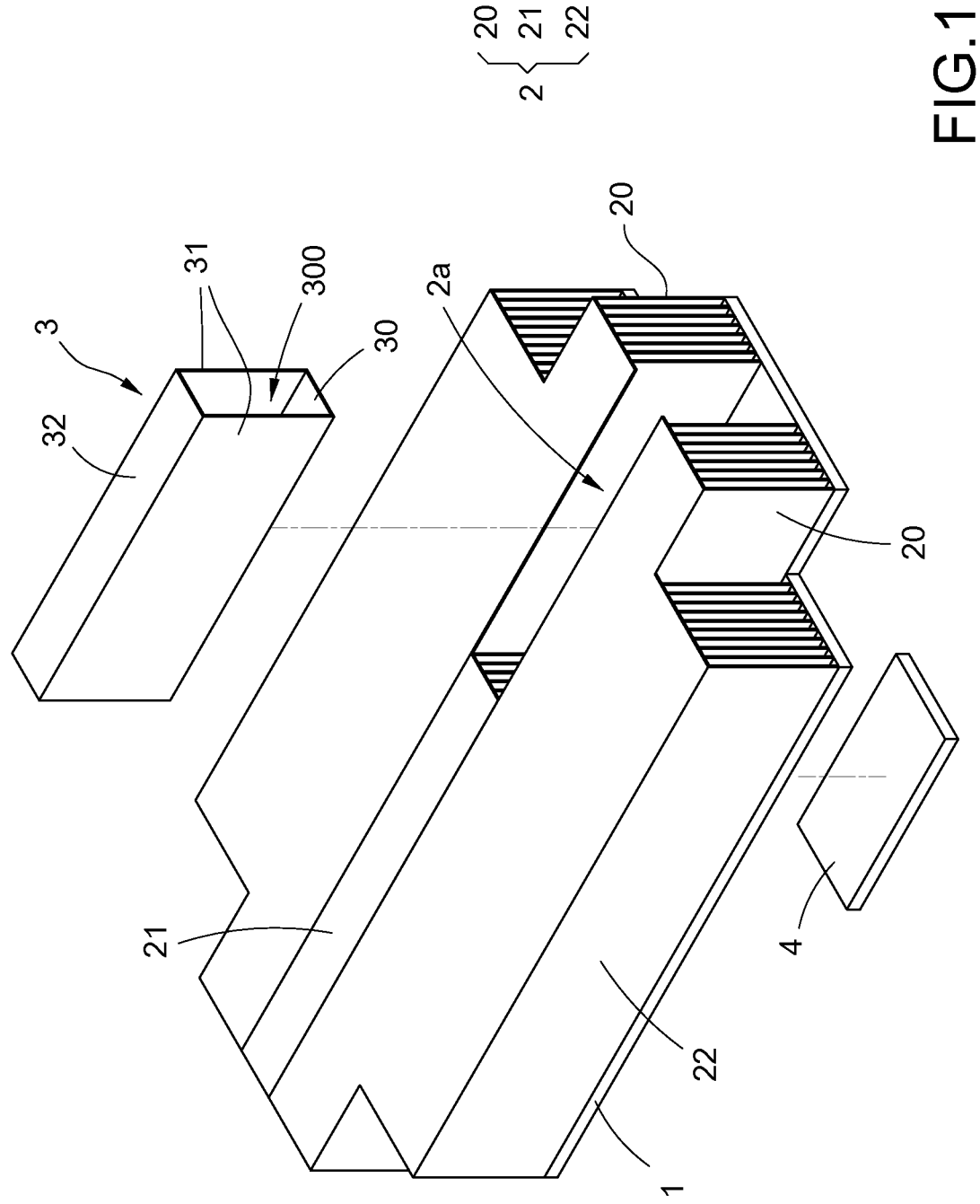
FIG. 1 is a schematic view showing the three-dimensional decomposition of this disclosure.
Figure 2:
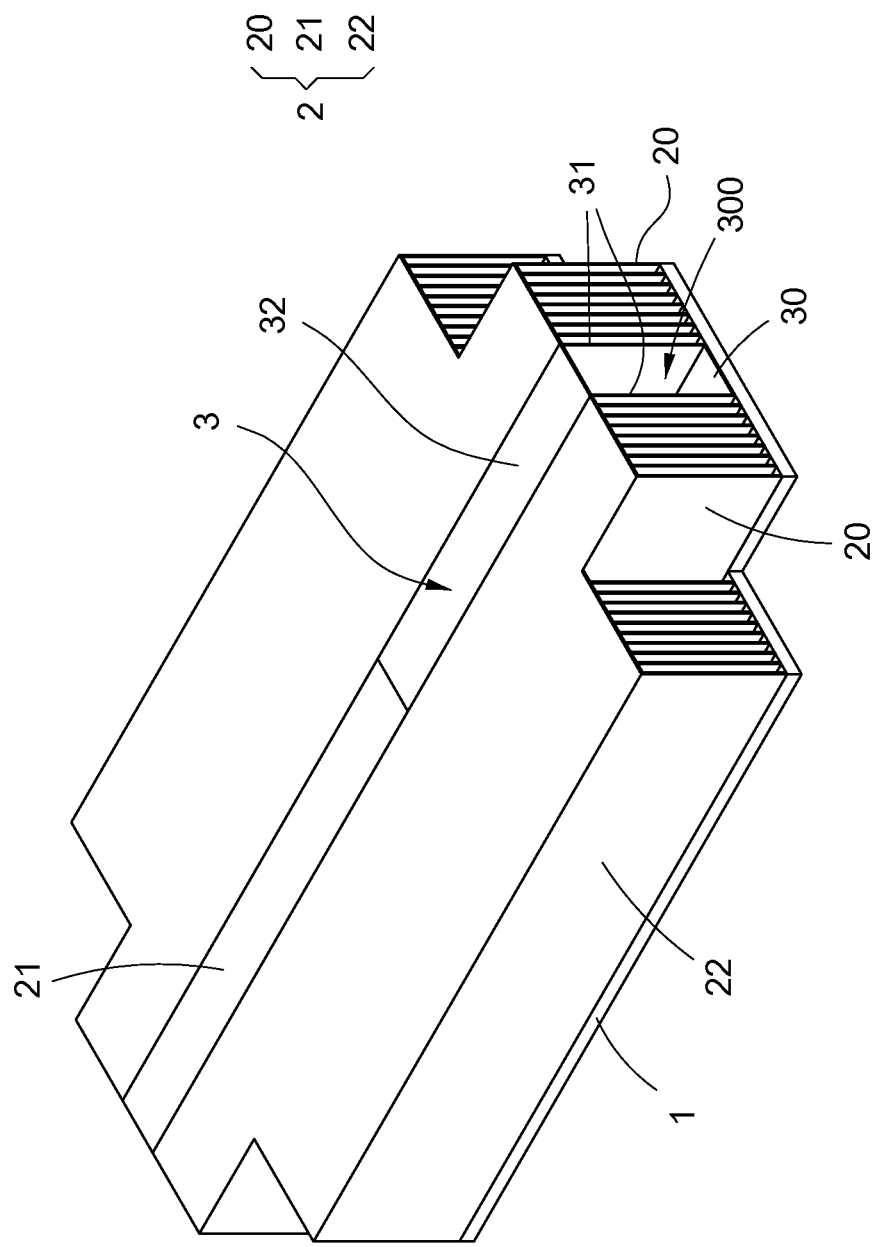
FIG. 2 is a schematic view showing the three-dimensional composition of this disclosure.

With reference to FIGS. 1 and 2 for the schematic views showing the three-dimensional decomposition and composition of this disclosure respectively, this disclosure provides a heat dissipation device with a heat-insulating channel. The heat dissipation device includes a thermal conductive substrate 1, a plurality of heat dissipation fins 2 disposed on the thermal conductive substrate 1, and at least one insulation guiding component 3.

Figure 3:
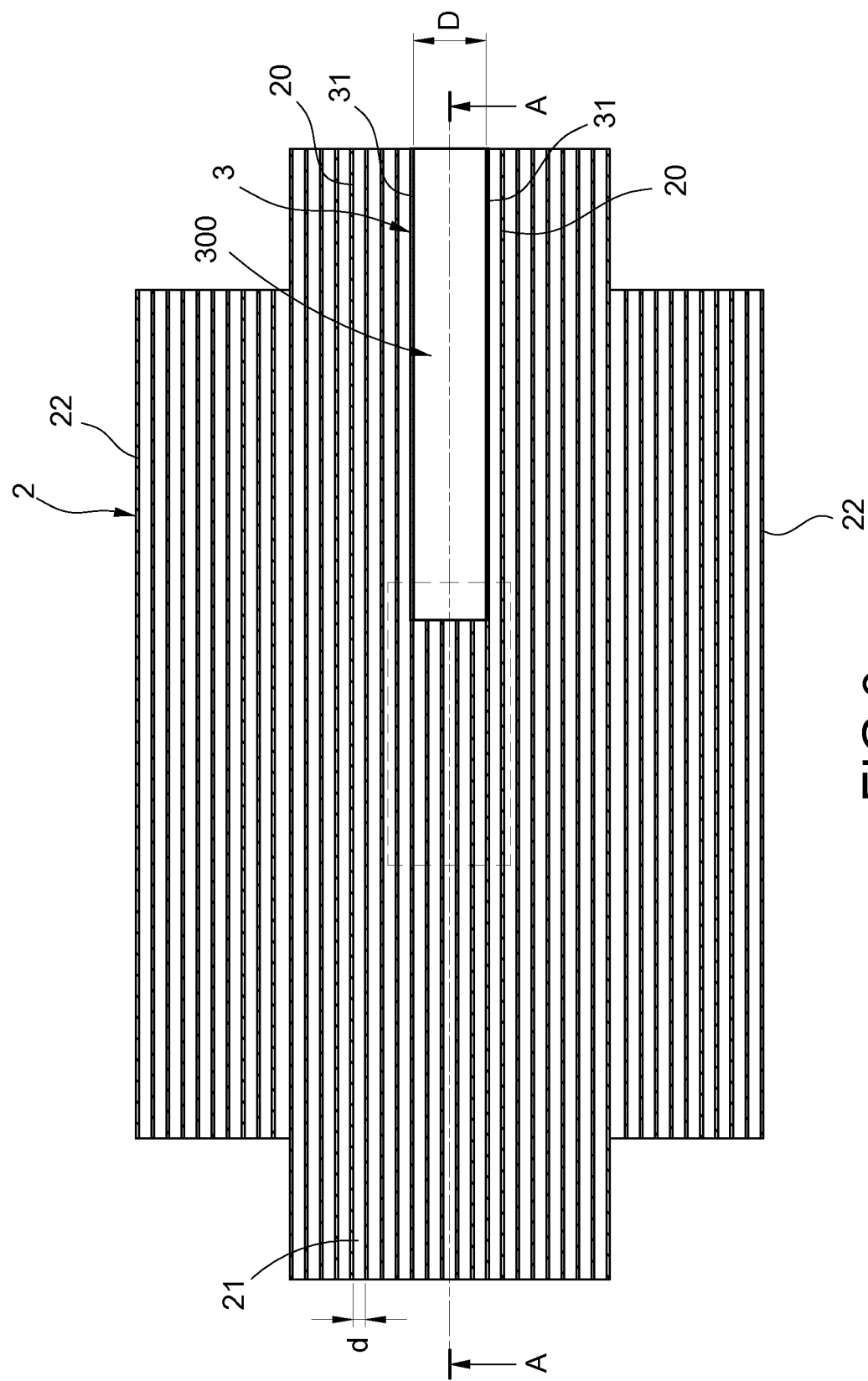
FIG. 3 is a flat top view of this disclosure.

The thermal conductive substrate 1 is made of a material with desirable thermal conductivity such as copper or aluminum, etc. In an embodiment of this disclosure, the thermal conductive substrate 1 is in a flat shape, and the bottom of the thermal conductive substrate 1 is attached onto a surface of a heat source 4 such as an electronic heat generating component, for assisting the heat dissipation of the heat source 4. In some other embodiments, the thermal conductive substrate 1 may be a vapor chamber, or a heat pipe composed of a solid plate (not shown in the figures). The heat dissipation fins 2 are also made of a material with desirable thermal conductivity such as copper or aluminum, etc. The heat dissipation fins 2 are stacked on the thermal conductive substrate 1 with a spacing from one another. In an embodiment of this disclosure as shown in FIG. 3, each heat dissipation fin 2 is erected from the thermal conductive substrate 1, and any two adjacent heat dissipation fins 2 are stacked and spaced with a spacing d from each other, such that external airflow (as shown in FIG. 4) enters between any two adjacent heat dissipation fins 2 to carry away the heat generated by the heat source 4 and absorbed by each heat dissipation fin 2.

In FIGS. 1 and 2, the insulation guiding component 3 is made of an insulation material, in some embodiments, made of plastics with desirable thermal insulation. The insulation guiding component 3 has a bottom portion 30, two sides 31 upwardly extended from the bottom portion 30, and a channel 300 collectively enclosed by the bottom portion 30 and the two sides 31. A configuration space 2a is defined on the heat dissipation fins 2 and provided for installing the insulation guiding component 3, and the bottom portion 30 of the insulation guiding component 3 is attached to the thermal conductive substrate 1, and the two sides and the heat dissipation fins 2 are extended in the same direction. In FIG. 3, the configuration space 2a (or channel 300) has a width D at least greater than spacing d between any two adjacent heat dissipation fins 2 to avoid a too-small spacing d that may increase the flow resistance and hinder the entry of the external airflow.

Figure 4:
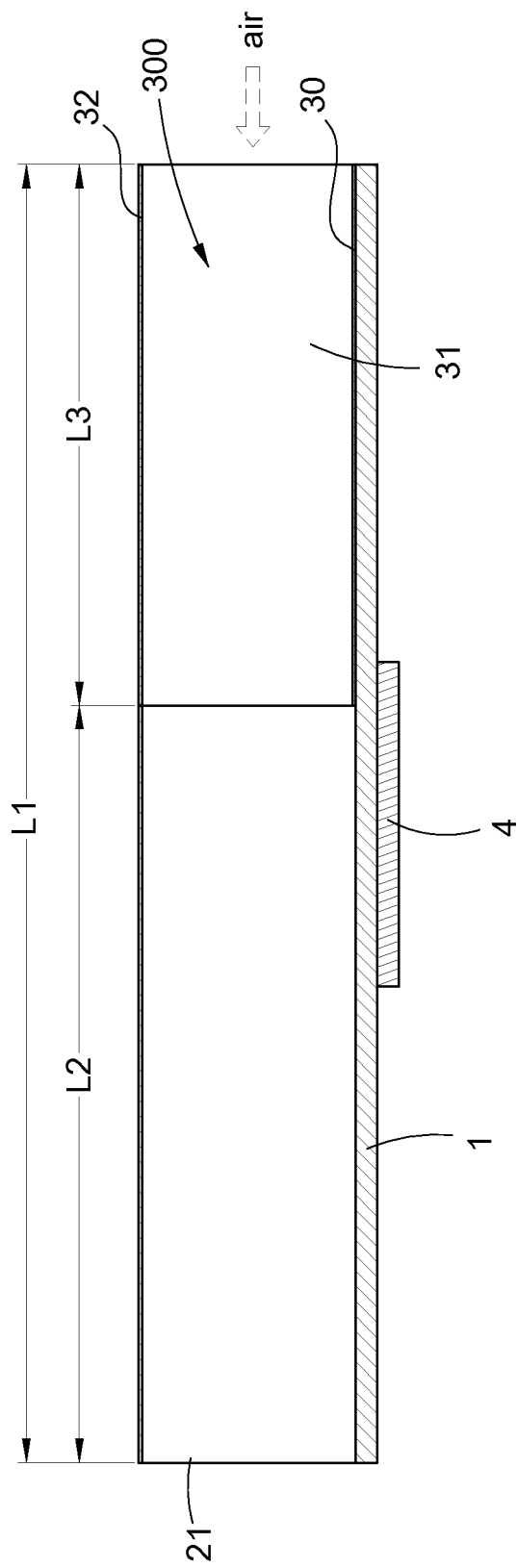
FIG. 4 is a cross-sectional view of Section 4-4 of FIG. 3.

In FIGS. 1, 2 and 4, the heat dissipation fins 2 of this embodiment includes a first fin 20, a second fin 21 and a third fin 22. A plurality of the second fin 21 are arranged between two groups of the first fin 20 Each group has a plurality of the first fins 20. The first fin 20 has a length L1 greater than the length L2 of the second fin 21. The insulation guiding component 3 is also disposed between the two groups of first fin 20, the insulation guiding component 3 has a length L3 that can be arranged in the configuration space 2a (the length of the configuration space 2a is L1−L2=L3), such that an end of the channel 300a of the insulation guiding component 3 may directly face toward the external airflow (as shown in FIG. 4), and when the external airflow passes through the channel 300 and enters into the insulation guiding component 3, the insulation function of the bottom portion 30 and the two sides 31 of the insulation guiding component 3 slows down the influence of the temperature rise caused by the heat absorption of each heat dissipation fin 2, before the external airflow reaches the upper part of the corresponding heat source 4 in the heat dissipation fins 2. As a result, the external airflow is guided to the upper part of the corresponding heat source 4 in the heat dissipation fin 2 at a lower temperature, and the heat resistance and flow resistance are reduced in the heat dissipation fin 2, thereby improving the heat dissipation efficiency of the convection through by external airflow.

The insulation guiding component 3 further includes a top portion 32 connected to the top between two sides 31 and closing the upper part of the channel 300, so as to guide the external airflow into the channel 300.

In FIGS. 1 and 2, the third fin 22 of this embodiment may be further expanded. Therefore, the heat dissipation fin 2 of this disclosure is not limited to the above-mentioned first and second fins 20, 21 only, but more than two fins (such as adding the third fin 22) may be arranged on the thermal conductive substrate 1 according to actual needs.

Figure 5:
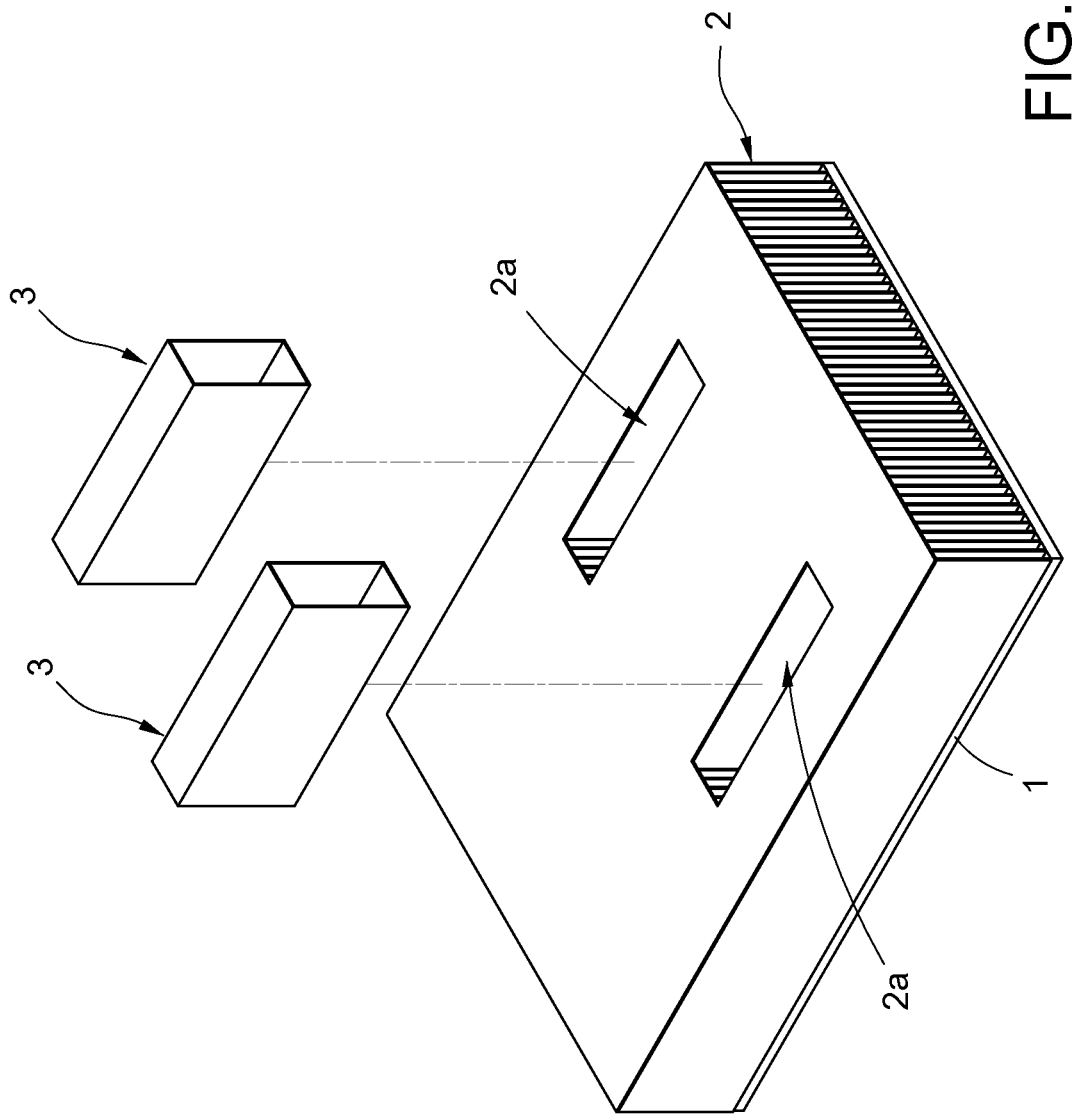
FIG. 5 is a schematic view showing the three-dimensional decomposition of another embodiment this disclosure.

In some other embodiments of this disclosure as shown in FIG. 5, there is a plurality of insulation guiding components 3 which is set according to the heat source (not shown in the figures) corresponding to the thermal conductive substrate 1. Each insulation guiding component 3 ensures that the external airflow maintains a relatively low temperature, and the status of the relatively low temperature of the external airflow is used to reduce the heat gathered at the upper part of the heat source, thereby effectively improving the heat dissipation efficiency of the airflow on the convection, and reducing the heat resistance and flow resistance in each heat dissipation fin 2 by guiding the airflow. Overall speaking, it is possible to reduce the cost and the material of the heat dissipation fins 2 by the configuration of insulation guiding components 3.

Therefore, with the above-mentioned structure, the heat dissipation device with a heat-insulating channel in accordance with this disclosure is obtained.

While this disclosure has been described by means of specific embodiments, numerous modifications and variations could be made thereto by those skilled in the art without departing from the scope and spirit of this disclosure set forth in the claims.

What is claimed is:

1. A heat dissipation device, comprising:
   a thermal conductive substrate;
   a plurality of heat dissipation fins, spacedly stacked on the thermal conductive substrate, and a configuration space defined between the heat dissipation fins; and
   at least one insulation guiding component, disposed in the configuration space, and comprising a bottom portion, two sides upwardly extended from the bottom portion, and a channel collectively enclosed by the bottom portion and the two sides;
   wherein, a width of the channel is at least greater than a spacing between any two heat dissipation fins adjacent to each other.

2. The heat dissipation device according to claim 1, wherein the thermal conductive substrate is in a form of a flat plate, or a vapor chamber, or a solid plate assembled with a heat pipe.

3. The heat dissipation device according to claim 1, wherein a bottom of the thermal conductive substrate is disposed corresponding to at least one heat source, and the channel of the insulation guiding component is located corresponding to a top of the heat source.

4. The heat dissipation device according to claim 1, wherein the heat dissipation fins are vertically disposed on the thermal conductive substrate.

5. The heat dissipation device according to claim 1, wherein the two sides of the insulation guiding component and the heat dissipation fins are extended in a same direction.

6. The heat dissipation device according to claim 1, wherein the heat dissipation fins comprise a first fin and a second fin, a plurality of the second fins is arranged between two sets of the first fin, and a length of the first fin is greater than a length of the second fin.

7. The heat dissipation device according to claim 6, wherein a length of the insulation guiding component is equal to a difference of the length of the first fin and the length of the second fin.

8. The heat dissipation device according to claim 7, wherein the insulation guiding component is disposed between the two sets of the first fin.

9. The heat dissipation device according to claim 6, wherein the insulation guiding component is disposed between the two sets of the first fin.

10. The heat dissipation device according to claim 1, wherein the insulation guiding component is multiple in number.

11. The heat dissipation device according to claim 10, wherein each of the insulation guiding component further comprises a top portion coupled to a top between the two sides and closing a top of the channel.

12. The heat dissipation device according to claim 1, wherein the insulation guiding component further comprises a top portion coupled to a top between the two sides and closing a top of the channel.

* * * * *